United States Patent [19]

Chen et al.

[11] Patent Number: 4,975,221
[45] Date of Patent: Dec. 4, 1990

[54] HIGH PURITY EPOXY FORMULATIONS FOR USE AS DIE ATTACH ADHESIVES

[75] Inventors: Shuhchung S. Chen, Belle Mead; Jules E. Schoenberg, Scotch Plains, both of N.J.; Song Park, Fullerton, Calif.

[73] Assignee: National Starch and Chemical Investment Holding Corporation, Wilmington, Del.

[21] Appl. No.: 350,987

[22] Filed: May 12, 1989

[51] Int. Cl.$^5$ ............................................. H01B 1/06
[52] U.S. Cl. ..................................... 252/512; 252/513; 252/514; 252/518; 252/520; 252/521; 523/454; 523/458; 523/427; 428/418; 428/413; 156/330
[58] Field of Search ............... 252/518, 520, 512, 513, 252/514, 521, 62, 3 T; 523/457–459, 427, 428, 433, 466; 525/42, 43, 407, 423; 428/413, 418, 901; 156/330; 437/1; 357/8

[56] References Cited

U.S. PATENT DOCUMENTS

| | | | |
|---|---|---|---|
| 2,965,607 | 12/1960 | Martin et al. | 260/47 |
| 3,576,903 | 4/1971 | Groff | 260/824 |
| 3,637,901 | 1/1972 | Bargain et al. | 260/830 P |
| 3,663,651 | 5/1972 | Traut | 260/830 P |
| 3,763,087 | 10/1973 | Holub et al. | 260/41 R |
| 3,856,752 | 12/1974 | Bateman et al. | 260/65 |
| 3,920,768 | 11/1975 | Kwiatkowski | 260/837 R |
| 3,998,779 | 12/1976 | Baer | 260/37 EP |
| 4,118,535 | 10/1978 | Banucci et al. | 428/383 |
| 4,127,615 | 11/1978 | Zahir et al. | 260/837 R |
| 4,212,959 | 7/1980 | Fukami et al. | 525/524 |
| 4,237,262 | 12/1980 | Jones | 528/322 |
| 4,312,793 | 1/1982 | Charneski et al. | 252/513 |
| 4,353,816 | 10/1982 | Iwasa | 252/512 |
| 4,401,767 | 8/1983 | Dietz et al. | 501/19 |
| 4,401,777 | 8/1983 | Tsuboi et al. | 523/451 |
| 4,418,166 | 11/1983 | Chesney, Jr. et al. | 523/400 |
| 4,436,785 | 3/1984 | Dietz et al. | 428/427 |
| 4,459,166 | 7/1984 | Dietz et al. | 156/89 |
| 4,479,890 | 10/1984 | Profhu et al. | 252/511 |
| 4,557,860 | 12/1985 | DiSalvo et al. | 252/512 |
| 4,604,230 | 8/1986 | Goswami et al. | 252/514 |
| 4,624,998 | 11/1986 | Keil | 525/476 |
| 4,652,398 | 3/1987 | Goswami et al. | 252/514 |
| 4,668,736 | 5/1987 | Robins et al. | 525/65 |
| 4,692,272 | 9/1987 | Goswami et al. | 252/514 |
| 4,756,848 | 7/1988 | Treze et al. | 252/514 |
| 4,835,240 | 5/1989 | Togashi et al. | 252/511 |

FOREIGN PATENT DOCUMENTS

1256531 12/1971 United Kingdom .
1258241 12/1971 United Kingdom .

OTHER PUBLICATIONS

Dietz et al. "An Innovation In Materials for Attaching Silicon Devices".
Noshay et al. Journal of Polymer Science, 12, pp. 689–705 (1974).
C. C. Proctor, Paint and Resin, May/Jun., 1982, pp. 18–20.

*Primary Examiner*—Josephine Barr
*Attorney, Agent, or Firm*—Royal N. Ronning, Jr.; Edwin M. Szala

[57] ABSTRACT

This invention presents improved epoxy-based die attach adhesives which are of low viscosity, high ionic purity, and stable toward thermal cycling. This improvement is obtained by including in the formulation carboxy terminated polymers which are the reaction products of polyether diols with cyclic dianhydrides.

17 Claims, No Drawings

HIGH PURITY EPOXY FORMULATIONS FOR USE AS DIE ATTACH ADHESIVES

BACKGROUND OF THE INVENTION

Adhesive compositions, particularly conductive adhesives, have recently gained great popularity in the microelectronics industry. These adhesives are used for a variety of purposes with one of the more prominent uses being the attachment of semiconductor dies or chips, to a substrate, or other support medium. A common problem associated with these adhesives is their rigidity or inflexibility. When used to attach chips to a metallic lead frame, stress will be placed upon the adhesive during thermal cycling, due to the dissimilar thermal expansion coefficients of the adhesive and the metal frame. Such stress often leads to adhesive failure or fracture of the silicon die chip. Another problem in regard to such adhesives is ionic contamination by alkali metal (e.g. sodium and/or potassium) and chloride species which, under certain circumstances, can lead to corrosion of the electrical leads in the vicinity of the adhesive.

Recently, in U.S. Pat. No. 4,557,860 to A. L. DiSalvo et al., an adhesive system was described which comprised, as essential ingredients, an epoxy resin, a soluble polyimide resin, and a monoepoxy diluent. Such an adhesive is curable by use of conventional epoxy curing agents. If conductive adhesives are desired, a suitable conductive filler can be added to such compositions. However, introduction of such fillers can cause the adhesive to be contaminated with ionic species undesirable for use in many electronic applications.

Other epoxy modifiers, notably carboxy terminated butadiene acrylonitrile copolymers, have been used as epoxy "toughening agents", to increase the flexibility and peel strengths of the adhesives, (eventually leading to chip fracture) but these, too, have been unable to allow the adhesive to relieve stress thermal during cycling, which is indicative of the unsuitability of the adhesive in normal use. The adhesives were also prone to contamination with undesirable ionic species.

Further, most epoxy adhesives with added toughening agents have high viscosities and require the addition of diluents to reduce these viscosities to levels for normal use. Such diluents often are ionically impure, making the adhesives less desirable for use in electronic applications.

There exists a real need for high purity, low viscosity adhesives which are stable toward thermal cycling for use in die attach applications.

SUMMARY OF INVENTION

It is an object of this invention to present an epoxy-based adhesive composition adapted for use as a die attach adhesive. It is further an object of this invention to present an epoxy-based adhesive composition which exhibits high ionic purity, low viscosity, and flexibility under long term thermal cycling.

The above and related objects are achieved by the adhesives of this invention. These adhesives comprise admixtures of conventional epoxy resins with a modifier. The modifier comprises carboxy terminated polymers which are the reaction product of a polymeric diol, polyol, or diamine with a cyclic dianhydride.

The carboxy terminated polymers useful in this invention are of the general formula:

wherein
R' is a $C_2$-$C_{20}$ straight or branched chain or cyclic saturated or unsaturated aliphatic or aromatic hydrocarbon R is a linear hydrocarbon having ether linkages or linear hydrocarbons substituted with sulfone, sulfide, phosphonate, phosphine oxide, silane, or siloxane, preferably a linear hydrocarbon having ether linkages, X is O, NH, or NR'', R'' is $C_1$-$C_{10}$ alkyl, aryl, or alkenyl, and n is at least 1.

Such modified epoxy adhesives can be used in die attach adhesives, wherein the modified epoxy is admixed with metallic silver, gold, copper, or nickel and a curing agent (and any other agents which are desired) to form a die attach adhesive. These die attach adhesives are useful in a variety of electronic applications including mounting semiconductor devices on printed circuit boards.

DETAILED DESCRIPTION OF INVENTION

The die attach adhesives of this invention comprise an epoxy base adhesive modified with a carboxy terminated polyether (CTPE) modifying agent.

The CTPE agents are the reaction products of a polymeric diol, preferably a polyether diol, with a cyclic dianhydride, and have the following formula:

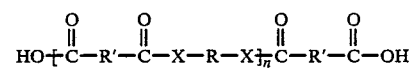

wherein
R' is $C_2$-$C_{20}$ straight or branched chain or cyclic saturated or unsaturated aliphatic or aromatic hydrocarbon, R is a linear hydrocarbon having ether linkages or linear hydrocarbons substituted with sulfone, sulfide, phosphonate, phosphine oxide, silane, or siloxane, preferably a linear hydrocarbon having ether linkages, p X is O, NH, or NR'';

R'' is $C_1$-$C_{10}$ alkyl alkenyl, or aryl; and n is at least 1.

Of particular use in the instant invention are CTPE agents of the following structure

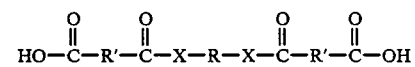

wherein
R' is a $C_2$-$C_{20}$ straight or branched chain or cyclic saturated or unsaturated aliphatic or aromatic hydrocarbon, divalent radical and is the residue of the cyclic anhydride.

R is a linear polyether of molecular weight 500-5000 obtained by the removal of hydroxyl groups from an oligomeric polyol, X is O.

Suitable polyethers comprise linear polyethers having molecular weights of 500-5000, preferably 1000-2500 more preferably 1800-2200.

Particularly suitable of polyethers obtained from polypropylene glycol having the structure

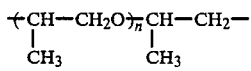

wherein n is at least 8, and those obtained from polytetramethylene glycol having the structure

wherein n is at least 7.

The CTPE agents of this invention are preferably formed by the reaction of oligomeric polyols, preferably diols such as polyethylene glycol, polypropylene glycol, polytetramethylene glycol or copolymers thereof, with cyclic anhydrides, preferably succinic anhydride or phthalic anhydrides; also useful are amine terminated polymers in place of the polyols.

In actual practice, the product is formed by reacting the polyol with the anhydride in a solvent in which both are soluble at an appropriate temperature (optionally in the presence of a catalyst such as a tertiary amine) to assure formation of the product. The solvent is then removed by any convenient means, preferably vacuum distillation.

These CTPE modifier materials are admixed with the epoxy resin at a concentration ranging from 2-50 parts per hundred parts epoxy (PHR) (by wt.) based on the total weight of the epoxy and modifier), preferably 10-40 parts per hundred parts epoxy (PHR) (by wt). This results in a modified epoxy resin of low viscosity and high ionic purity which is advantageously capable of withstanding several thermal cycles without bond failure or cracking.

In many cases, especially when amine curing agents are used, it is also desirable to pre-react the CTPE modifier with the epoxy to assure that the modifier is fully reacted after cure. This pre-reaction is accomplished by heating modifier with one or more of the epoxy compounds to 125-175° C. for 1-2 hours in the presence of catalysts (such as triphenyl phosphine and quaternary phosphonium salts), until all of the carboxyl groups are reacted. The reaction can be monitored by the disappearance of carboxyl groups by any convenient method.

Suitable epoxy resins include the liquid or solid diglycidyl ethers of polyhydric phenols such as resorcinol or bisphenol A, triseposides, aliphatic diepoxides, and cycloaliphatic diepoxides. Other useful epoxy resins include those described in U.S. Pat. No. 3,739,041 incorporated herein by reference, and the ethers of epoxy substituted phenols described in U.S. Pat. No. 2,965,607, also incorporated by reference. It is, thus, to be recognized that virtually any epoxy can be utilized, the only restraint being the ultimate application in which the epoxy is to be used.

These modified epoxy resins can be used as die attach adhesives. In such adhesives the epoxy resins are admixed with a curing agent, and either electrically or thermally conductive fillers. Suitable electrically conductive fillers include flaked or powdered, or a mixture of both forms, metallic silver, gold, copper, or nickel (preferably silver). Suitable thermally conductive fillers include magnesium oxide, calcium carbonate, silicon dioxide, titanium dioxide, and alumina. The adhesives can also contain other fillers and ingredients as may be desired (including catalysts and adhesion promoters). Suitable curing agents include phenolic novalacs, aromatic amines or diamines, and dicyandiamides, and suitable adhesion promotors include epoxy functional silanes. Optionally catalysts, which catalyze the curinq agent or the polymerization of the epoxy (thereby shortening the cure time) can used in the adhesive. Typical catalysts include substituted ureas, substituted imidazoles, and tertiary amines such as dimethylbenzyl amine.

While it is to be recognized that the precise components used in the adhesive can be varied as individual circumstances dictate, representative compositions are presented below

| Epoxide(s) | 100-125 parts (by wt) |
| Modifier | 3-50 parts (by wt) |
| Curing agent | 0-22 parts (by wt) |
| Catalyst | 2.5-10 parts (by wt) |
| Adhesion Promoter | 0-2 parts (by wt) |
| Metal | 300-650 parts (by wt) |

The die attach adhesives can be used in a variety of applications including the attachment of semiconductors to printed circuit boards.

EXAMPLES

The following examples illustrate certain preferred embodiments of this invention but are not intended to be illustrative of all embodiments.

Example I

This example illustrates the preparation of a carboxy-terminated polyether (CTPE) from polytetramethylene glycol.

To a 3 liter, 4-neck round bottom flask equipped with condenser, thermometer, mechanical stirrer and nitrogen inlet was charged 990.2g of Terathane 1000 [DuPont, poly (tetramethylene glycol), MW ~ 1000)]200.2g of succinic anhydride and 150 ml of toluene. The reaction mixture was heated to reflux for 4 hours (reflux temperature 160° C.). After the reaction was complete, the mixture was transferred to a one-neck round bottom flask and the volatiles were removed on a rotary evaporator under high vacuum. Typical yield of this clear, viscous resin was 99%. Neutralization equivalent was 618 gm/eq. (theoretical NE=590).

Additional samples were made in the same manner using Terathane 650 and Terathane 2000 to yield products of different molecular weights.

Example II

This example illustrates the preparation of a carboxy-terminated polyether from polypropylene glycol (PPG) in the presence of a catalyst.

To a 3-liter, 4-neck round bottom flask equipped with condenser, thermometer, mechanical stirrer and nitrogen inlet was charged 813.04g of polypropylene glycol (PPG) of 2000 molecular weight, 80.08g of succinic anhydride, 5 ml of triethylamine and 600 ml of toluene. The reaction was brought to a gentle reflux (~120° C.) for 6 hours (until the anhydride peaks disappeared in Infrared spectra). The reaction mixture was then cooled to room temperature and washed 3 times with distilled water. The toluene solvent was removed under high vacuum, and the neutralization equivalent was determined to h=1128.1 gm/eq. (theoretical NE=1091)

Example III

Using the procedure described in Example II, Terathane 1000 [DuPont polytetramelthylene glycol, MW 1000] was reacted with phthalic anhydride. The neutralization equivalent of the resulting resin was 696.1 gm/eq. (theoretical NE=643.2).

Example IV - Epoxy Formulations

The carboxy-terminated polytetramethylene glycol obtained in Example I from Terathane 1000 was formulated into Epon 828 (Bisphenol A diglycidyl ether, Shell Chemical). The adhesives were made by pre-reacting Epon 828 with the carboxy modifier at 150° C. for 1 hour in the presence of 0.2% triphenyl phosphine and then cured by the stoichiometric amount of 4,4' diamino diphenyl sulfone (DES). The T-peel strength was determined on an Instron tester according to ASIM D1876-72:

| Sample | Level of Modification (by wt. PHR) | T-Peel Strength |
|---|---|---|
| A | None | <1 pli |
| B | 20 | 1.2 pli |
| C | 30 | 5 pli |
| D | 40 | 26 pli |
| E | 50 | 30 pli |

This example demonstrates the toughening of the epoxy Bisphenol A diglycidyl ether by carboxyl-terminated polyether, as evidenced by approved peel strength, as the level of modifier is increased.

Example V - Epoxy Formulations

This example illustrates the use of other carboxyl-terminated polyethers in toughening epoxies. All conditions, including the curing agent, were identical to Example IV.

| Sample | Modifier* | Level of Modification (by wt. PHR) | T-Peel Strength |
|---|---|---|---|
| F | I | 40 | 21 pli |
| G | I | 30 | 15 pli |
| H | II | 40 | 20 pli |
| J | III | 20 | 7.5 pli |
| K | IV | 40 | 8 pli |

*Modifier
 I: polypropylene glycol (MW 1000) - succinate
 II: polytetramethylene glycol (MW~1000) - phthalate
 III: polytetramethylene glycol (MW~2000) - succinate
 IV: polytetramethylene glycol (MW~650) - succinate

Example VI

This example demonstrates the thermal shock resistance of the modified epoxy.

The adhesive formulation consists of bisphenol F diglycidyl ether epoxy, a CTPE modifier, curing agent, adhesion promoter and conductive metal. The electronic components were assembled and the adhesive cured. The finished components were heated in a 150° C. oven and then dropped into a −78° C. cold bath. The number of cycles that the adhesive could withstand without either the die or adhesive cracking were recorded as an indication of thermal shock resistance. Further, the Shore D hardness of the formulations after a 24 hour incubation at 150° C. was determined.

The formulation was as follows:

|  | L | M | N |
|---|---|---|---|
| Bisphenol F diglycidyl ether | 55 parts | 60 parts | 50 parts |
| Modifier | 35 parts* | 20 parts | 25 parts |
| Aliphatic Diepoxide | 10 parts | 20 parts | 25 parts |
| Adhesion promoter | 1 part | 1 part | 1 part |
| Proprietary catalyst | 8.5 parts | 8.5 parts | 8.5 parts |
| Silver | 500 parts | 500 parts | 500 parts |

*a bisphenol F-CTBN adduct containing approx. 30% (by wt.) CTBN

The thermal shock resistance results are summarized below:

| Sample | Type of Modifier | Level of Modification (by wt. PHR) | Cycles to Fail | Shore D after 150° C./ 24 hrs. |
|---|---|---|---|---|
| L | CTBN 1300 × 13 conventional toughening agent | 12 | 1 | 87 |
| M | Mod. III (Ex. V) | 25 | 9 | 81 |
| N | Mod. III (Ex. V) | 33 | >25 | 75 |

As shown, it can be seen that the formulations containing the modifier of the invention were much more resistant to thermal shock, remaining stable for many more cycles and having a lower hardness after the 150° C. incubation.

Example VII

This example demonstrated the advantage of having low viscosity of CTPE which allowed much higher silver loading for specific application.

|  | Formulation I | Formulation II |
|---|---|---|
| Proprietary Epoxides | 100 parts | 100 parts |
| Curing Agent (phenol novalac) | 12.5 parts | 12.5 parts |
| Modifier CTBN (Hycar) | 25 parts | — |
| Modifier CTPE - invention (Modifier III, Ex.V) | — | 25 parts |
| Aliphatic Diglycidyl ether | 30 parts | 15 parts |
| Proprietary Catalyst | 3 parts | 3 parts |
| Adhesion Promoter | 0.5 parts | 0.5 parts |
| Silver | 510 parts | 710 parts |
| Viscosity | 18,000 cps | 7,300 cps |
| Lap Shear Strength (1 hr, 150° C.) | 1170 psi | 1360 psi |

As indicated in Formulation II above, low viscosity of the CTPE allowed 82% silver loading. If same amount of silver were to be used in Formulation I, the viscosity would be too high to handle. Further, the quantity of aliphatic diglycidyl ether (a viscosity reducer) added to formulation II was half that of I, yet the viscosity was much lower. A 20% increase in lap shear strength was also noted.

Example VIII

This example illustrates certain property performance characteristics for the adhesive composition described below:

| Bisphenol F diglycidyl ether | 50 parts |
|---|---|
| Modifier (CTPE) (Modifier II, Ex. V) | 20 parts |
| Aliphatic diglycidyl ether | 30 parts |
| Epoxy Cresol Novalac | 30 parts |

| | | |
|---|---|---|
| -continued | | |
| Diaminodiphenyl sulfone | 10 | parts |
| Proprietary catalyst | 2.5 | parts |
| Adhesion promoters | 1 | parts |
| Silver filler | 430 | parts |

In the preparation, the modifier was prereacted with the aliphatic diglycidyl ether at 150° C. for 1 hour in the presence of triphenyl phosphine.

This formulation was cured for 1 hour at 150° C. After this cure, the physical properties were examined.

| | % wt loss/temp | |
|---|---|---|
| Thermal gravimetric analysis (TGA) | 0.26% | 250° C. |
| in N$_2$ at a heating rate of 10° C./min. | 0.66% | 300° C. |
| | 1.52% | 350° C. |
| Volume resistivity (room temp.) | 1.4 × 10$^{-4}$ | ohm-cm |
| Lap shear strength (room temp. on Al—Al bonds) | 1775 psi | |
| Die shear strength (Cu lead frame, room T, 0.05" × 0.05" die on Dage die shear tester) | 3580 psi | |

The properties show that the cured adhesive is stable, highly conductive, and forms a strong bond.

EXAMPLE IX

This example illustrates the thermal shock stability, electrical conductivity, and lap shear strength for the adhesive composition described below:

| | | |
|---|---|---|
| Proprietary Trisepoxide | 100 | parts |
| Phenol Novalac Curing Agent | 12.5 | parts |
| Modifier I (Ex. V) | 20 | parts |
| Aliphatic Diepoxide | 6 | parts |
| Proprietary Catalyst | 2.5 | parts |
| Adhesion Promoter | 1.0 | parts |
| Silver Filler | 426 | parts |

The modifier and trisepoxide were pre-reacted as in Example IV, and portions of the formulation was then cured as follows:

| A. RT Die Shear Strength (on copper lead frame) | |
|---|---|
| Cure Schedule | Die Shear Strength |
| 150° C./1 hour | 5870 psi |
| 150° C./1 hour followed by a heating to 275° C., 10 seconds | 1850 psi |
| 175° C./1 hour | 4590 psi |
| 175° C./1 hour followed by a heating to 275° C., 10 seconds | 3975 psi |
| 200° C. 1 hour | 3420 psi |
| 200° C./1 hour followed by a heating to 275° C., 10 seconds | 3285 psi |

The data indicates that the adhesive maintains excellent die shear strength after thermal shock (275° C., 10 seconds).

| B. Electrical Conductivity | |
|---|---|
| Cure Schedule | Volume Resistivity |
| | (ohm-cm) |
| 150° C., 1 hour | 0.00024 |
| 175° C., 1 hour | 0.00021 |
| C. Lap Shear Strength | |
| Cure Schedule | Lap Shear (psi) |
| 150° C., 1 hour | 1255 |
| 175° C., 1 hour | 1280 |

It is apparent that many modifications and variations of this invention as hereinabove set forth may be made without departing from the spirit and scope thereof. The specific embodiments are given by way of example only and the invention is limited only by the terms of the appended claims.

What is claimed is:

1. In an epoxy-based die-attach adhesive composition, wherein the adhesive comprises one or more curable epoxy compounds, a conductive filler, and suitable curing agents the improvement comprising adding to said adhesive 2–50 PHR (by wt.) of an epoxy modifier which comprises a carboxy-terminated polymer of the general formula:

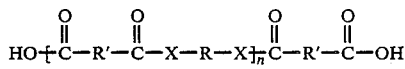

wherein
R' is a $C_2$-$C_{20}$ straight or branched chain or cyclic saturated or unsaturated hydrocarbon,
R is a linear hydrocarbon having ether linkages or linear hydrocarbons substituted with sulfone, sulfide, phosphonate, phosphine oxide, silane, or siloxane, preferably a linear hydrocarbon having ether linkages,
X is O, NH, or NR",
R" is $C_1$-$C_{10}$ alkyl, alkenyl, or aryl, and
n is at least 1,
such that the die attach adhesive is of low viscosity and stable toward thermal cycling.

2. The epoxy-based die attach adhesive of claim 1, wherein the carboxy terminated polymer added to the adhesive is about 2–50 parts per hundred parts epoxy by wt.

3. The epoxy-based die attach adhesive of claim 1, wherein the epoxy compound is selected from the group consisting of diglycidyl ethers of polyhydric phenols, trisepoxides, aliphatic diepoxides, and cycloaliphatic diepoxides.

4. The epoxy-based die attach adhesive of claim 1, wherein the carboxy terminated polymer is admixed with the epoxy.

5. The epoxy-based die attach adhesive of claim 1, wherein the carboxy terminated polymer is prereacted with the epoxy.

6. The epoxy-based die attach adhesive of claim 1, wherein the carboxy terminated polymer is the formula

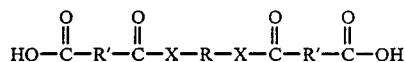

wherein
R' is a $C_2$-$C_{20}$ straight or branched chain or cyclic saturated or unsaturated aliphatic or aromatic hydrocarbon,
R is a linear polyether,
X is O.

7. The epoxy-based die attach adhesive of claim 6, wherein the linear polyether has a molecular weight of about 500 to about 5000.

8. The epoxy-based die attach adhesive of claim 6 wherein R is

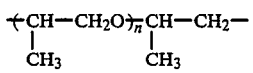

wherein n is at least 8.

9. The epoxy-based die-attach adhesive of claim 6 wherein R is

wherein n is at least 6.

10. The epoxy-based die attach adhesive of claim 1, which comprises 100–125 parts (by wt) of one or more epoxy compounds, 3–50 parts (by wt) of carboxy terminated polymer modifier, 0–20 parts (by wt) curing agent, 2.5–10 parts (by wt) catalyst, 0–2 parts (by wt) adhesion promoter, and 300–600 parts (by wt) conductive filler.

11. The epoxy-based die attach adhesive of claim 1, wherein the conductive filler is a thermally conductive filler selected from the group consisting of magnesium oxide, calcium barbonate, silicon dioxide, titanium dioxide, and alumina.

12. The epoxy-based die attach adhesive of claim 1, wherein the conductive filler is an electrically conductive filler selected from the group consisting of powdered or flaked, or a mixture of powdered and flaked metal.

13. The epoxy-based die attach adhesive of claim 12 wherein the curing agent is selected from the group consisting of phenol novalacs, aromatic amines, aromatic diamines, and dicyandiamides.

14. The epoxy-based die attach adhesive of claim 8, wherein the catalyst is selected from the group consisting of substituted ureas, substituted imidazoles, and tertiary amines.

15. The epoxy-based die attach adhesive of claim 14, wherein the catalyst is dimethylbenzylamine.

16. The epoxy-based die attach adhesive of claim 12, wherein the metal is selected from the group consisting of silver, gold, copper, and nickel.

17. A semiconductor device mounted on a substrate with the adhesive of claim 1.

* * * * *